(12) United States Patent
Maneatis

(10) Patent No.: US 6,788,154 B2
(45) Date of Patent: Sep. 7, 2004

(54) PHASE-LOCKED LOOP WITH COMPOSITE FEEDBACK SIGNAL FORMED FROM PHASE-SHIFTED VARIANTS OF OUTPUT SIGNAL

(75) Inventor: John George Maneatis, Redwood City, CA (US)

(73) Assignee: True Circuits, Inc., Los Altos, CA (US)

( * ) Notice: Subject to any disclaimer, the term of this patent is extended or adjusted under 35 U.S.C. 154(b) by 0 days.

(21) Appl. No.: 10/059,913

(22) Filed: Jan. 28, 2002

(65) Prior Publication Data
US 2002/0140513 A1 Oct. 3, 2002

Related U.S. Application Data (60) Provisional application No. 60/264,563, filed on Jan. 26, 2001, provisional application No. 60/264,628, filed on Jan. 26, 2001, provisional application No. 60/266,009, filed on Feb. 2, 2001, provisional application No. 60/316,702, filed on Aug. 31, 2001, and provisional application No. 60/316,703, filed on Aug. 31, 2001.

(51) Int. Cl.[7] ............................................. H03B 77/00
(52) U.S. Cl. ........................ 331/45; 331/48; 331/53; 331/34; 331/11; 331/74; 331/177 R; 331/16; 331/17; 327/156; 327/157; 327/159
(58) Field of Search .......................... 331/45, 48, 53, 331/34, 11, 74, 177 R, 16, 17; 327/156, 157, 159

(56) References Cited

U.S. PATENT DOCUMENTS

| | | | |
|---|---|---|---|
| 4,608,530 A | 8/1986 | Bacrania | |
| 4,644,536 A | 2/1987 | Utsumi | |
| 4,792,768 A | 12/1988 | Fried et al. | |
| 5,043,677 A | 8/1991 | Tomassetti et al. | |
| 5,375,148 A | 12/1994 | Parker et al. | |
| 5,399,995 A | 3/1995 | Kardontchik et al. | |
| 5,512,816 A | 4/1996 | Lambert | |
| 5,714,896 A | 2/1998 | Nakagawa et al. | |
| 5,727,037 A | 3/1998 | Maneatis | |
| 5,731,696 A | 3/1998 | Pennisi et al. | |
| 5,757,238 A | 5/1998 | Ferraiolo et al. | |
| 5,781,600 A | 7/1998 | Reeve et al. | |
| 5,821,816 A | 10/1998 | Patterson | |
| 5,877,658 A | 3/1999 | Baba | |
| 5,900,784 A | 5/1999 | O'Sullivan | |
| 5,903,194 A | 5/1999 | Opsahl et al. | |
| 5,970,110 A | 10/1999 | Li | |
| 5,986,485 A | 11/1999 | O'Sullivan | |
| 6,043,695 A | 3/2000 | O'Sullivan | |
| 6,111,470 A | 8/2000 | Dufour | |
| 6,114,914 A | 9/2000 | Mar | |
| 6,163,184 A | 12/2000 | Larsson | |
| 6,201,380 B1 | 3/2001 | Tsujino et al. | |
| 6,242,897 B1 | 6/2001 | Savage et al. | |
| 6,262,610 B1 | 7/2001 | Lo et al. | |
| 6,265,859 B1 | 7/2001 | Datar et al. | |
| 6,281,721 B1 | 8/2001 | Kinget et al. | |
| 6,292,039 B1 | 9/2001 | Burzio et al. | |
| 6,292,061 B1 | 9/2001 | Qu | |
| 6,320,435 B1 | 11/2001 | Tanimoto | |
| 6,329,882 B1 | 12/2001 | Fayneh et al. | |

Primary Examiner—Michael B Shingleton
(74) Attorney, Agent, or Firm—Kolisch Hartwell, P.C.

(57) ABSTRACT

A phase-locked loop system and method are provided. The system may include an error detector configured to receive a reference signal, and a voltage-controlled oscillator subsystem coupled to the error detector. The voltage-controlled oscillator subsystem is typically configured to produce a primary output signal that tends toward a predefined frequency relationship with the reference signal, and to produce a feedback signal that is routed in a feedback loop back to the error detector. The voltage-controlled oscillator subsystem typically includes a multiple output voltage-controlled oscillator having a plurality of VCO outputs. The voltage-controlled oscillator subsystem is typically configured to form the feedback signal from a plurality of the VCO outputs.

57 Claims, 8 Drawing Sheets

PHASE-LOCKED LOOP WITH COMPOSITE FEEDBACK SIGNAL FORMED FROM PHASE-SHIFTED VARIANTS OF OUTPUT SIGNAL

CROSS-REFERENCE TO RELATED APPLICATIONS

This application is based upon and claims priority under 35 U.S.C. §119 from the following co-pending U.S. provisional patent applications, each of which is incorporated herein by this reference, in its entirety and for all purposes: "Single-ended Zero Static Phase Offset Phase Locked Loops," Serial No. 60/264,563, filed Jan. 26, 2001; "Multistage Programmable Current Mirrors," Serial No. 60/264,628, filed Jan. 26, 2001; "Single-ended Zero Static Phase Offset Phase Locked Loops," Serial No. 60/266,009, filed Feb. 2, 2001; "Pseudo-differential Zero Static Phase Offset Phase Locked Loops," Serial No. 60/316,702, filed Aug. 31, 2001; and "Multistage Programmable Current Mirrors," Serial No. 60/316,703, filed Aug. 31, 2001.

TECHNICAL FIELD

The present invention relates to electronic circuits, and more particularly to phase-locked loops.

BACKGROUND OF THE INVENTION

Phase-locked loops (PLLs) are used in a wide variety of electronic devices to produce an output signal that is phase-aligned with a reference signal. One common use of PLLs is to generate an output frequency that is a rational multiple of the reference frequency, according to the equation $f_{out} = M/N * f_{ref}$. Prior PLLs accomplish this by dividing the reference signal $f_{ref}$ by M before the reference signal is passed to a phase frequency detector, and dividing a feedback signal within the PLL by N before the feedback signal is passed to the phase frequency detector.

Unfortunately, this approach removes M-1 of M of the reference clock edges leading to the phase frequency detector, eliminating most of the information used to keep the PLL tracking properly. This causes the PLL to make fewer, larger corrections in order to keep the output signal locked to the reference signal, resulting in undesirable tracking jitter in the output signal. This is particularly the case where N and M are large values, such as in high-speed applications requiring extremely precise phase alignment of the output signal to the reference signal. Since PLLs are often used to output clock signals that drive a variety of other devices, any long-term or tracking jitter in the output signal may have disastrous effects for the performance of the system overall.

It would be desirable to provide a PLL with decreased tracking jitter, to overcome the problems associated with the prior art.

SUMMARY OF THE INVENTION

A phase-locked loop system and method are provided. According to one aspect of the invention, the system typically includes an error detector configured to receive a reference signal, and a voltage-controlled oscillator subsystem coupled to the error detector. The voltage-controlled oscillator subsystem is typically configured to produce a primary output signal that tends toward a predefined frequency relationship with the reference signal, and to produce a feedback signal that is routed in a feedback loop back to the error detector. The voltage-controlled oscillator subsystem typically includes a multiple output voltage-controlled oscillator having a plurality of VCO outputs. The voltage-controlled oscillator subsystem is typically configured to form the feedback signal from a plurality of the VCO outputs.

According to another aspect of the invention, the phase-locked loop system includes an error detector configured to receive a reference signal, and a voltage-controlled oscillator subsystem configured to produce a primary output signal based on the reference signal, and to produce a feedback signal that is routed back to the error detector. The system may further include a correcting charge pump coupled to the output of the error detector. The correcting charge pump is typically configured to output a correcting pulse in response to a detected phase error between the reference signal and the feedback signal. The system may also include a canceling charge pump coupled to an output of the correcting charge pump. The canceling charge pump is typically configured to output a canceling pulse to compensate for at least a portion of the correcting pulse.

According to another aspect of the invention, the phase-locked loop method includes receiving a reference signal, and producing a primary output signal that tends toward a predefined frequency relationship with the reference signal. The method further typically includes generating a plurality of derivative signals based on the primary output signal, and producing a feedback signal based on the plurality of derivative signals.

According to another aspect of the invention, the phase-locked method includes receiving a reference signal and producing a primary output signal that tends toward a predefined frequency relationship with the reference signal. The method may further include producing a feedback signal that is based on the primary output signal and generating a correcting pulse in response to a detected phase error between the reference signal and the feedback signal. The method may also include generating a canceling pulse to compensate for at least a portion of the correcting pulse.

DETAILED DESCRIPTION OF THE INVENTION

The present invention will be described primarily in the context of phase-locked loops, in which error detection is achieved through use of phase frequency detectors. It will be appreciated, however, that the structures and methods of the present invention are applicable to a wide variety of settings in which error detectors and feedback are used to cause an output signal to have a desired characteristic. For example, other types of error detectors with which the present invention may be used include XOR devices, mixers, edge-triggered latches and sampling flip-flops.

Figures 1, 1A:
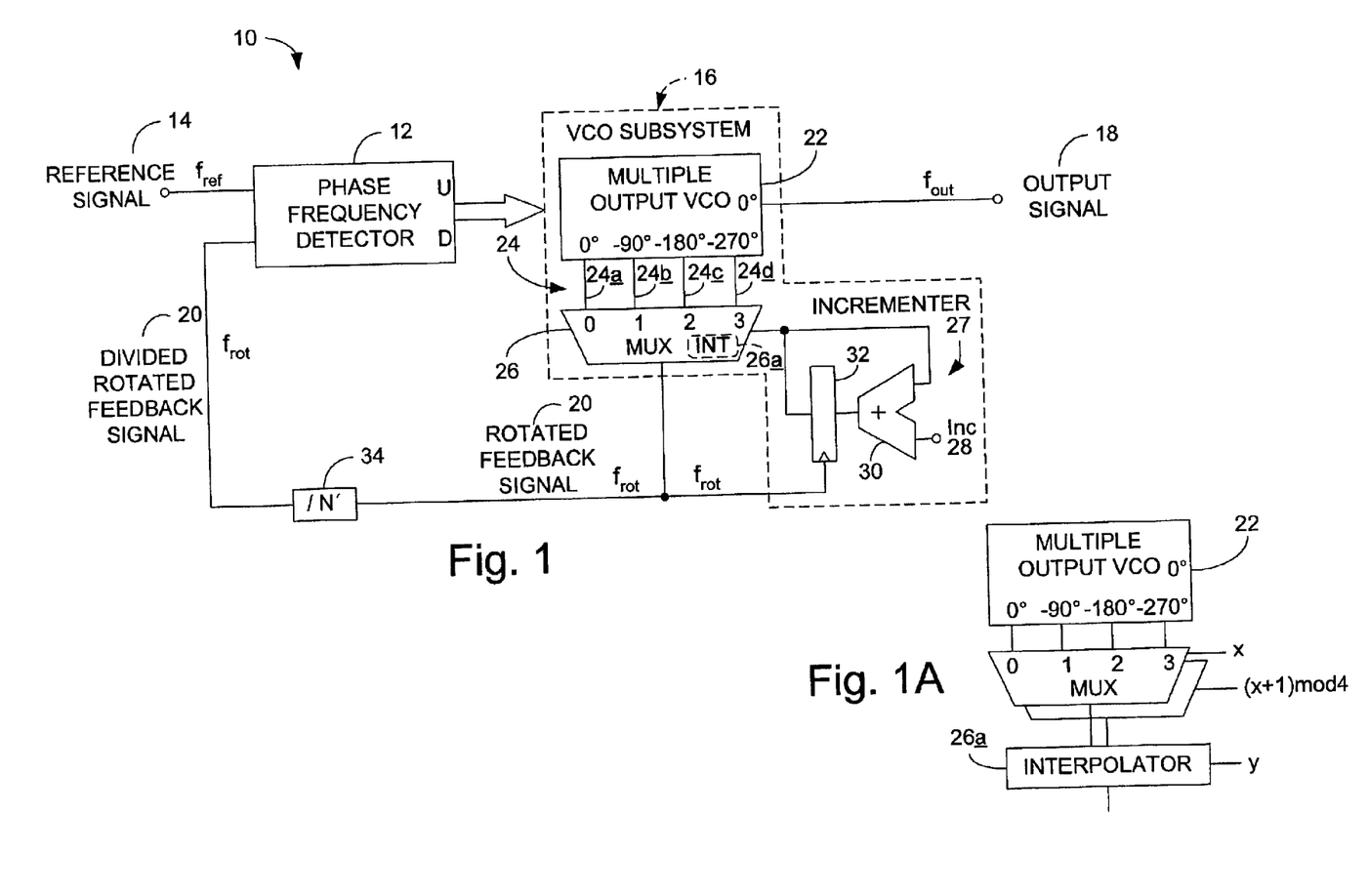
FIG. 1 is a schematic view of a phase-locked loop system according to one embodiment of the present invention.
FIG. 1A is a partial schematic view of the system of FIG. 1, showing an interpolator linked to two VCO output multiplexers.

Referring generally to FIG. 1, a phase-locked loop system according to one embodiment of the present invention is shown generally at 10. Phase-locked loop system 10 typically includes a phase frequency detector 12 configured to receive a reference signal ($f_{ref}$) 14. The phase frequency detector is coupled to a voltage-controlled oscillator (VCO) subsystem 16 that is configured to produce a primary output signal ($f_{out}$) 18 that tends toward a predefined frequency relationship with the reference signal. VCO subsystem 16 is also configured to produce a feedback signal ($f_{rot}$) 20, which is routed in a feedback loop back to the phase frequency detector. VCO subsystem 16 typically includes a multiple output voltage-controlled oscillator 22 having a plurality of VCO outputs 24. The voltage-controlled oscillator subsystem is configured to form the feedback signal from a plurality of the VCO outputs 24. The feedback signal is typically a non-integral multiple of the primary output signal, such that $f_{out} \leq f_{rot} \leq 2f_{out}$.

Phase frequency detector 12 is configured to compare the phase difference between the reference signal 14 and the feedback signal 20, and output speed up and/or slow down pulses out of outputs U (Up) and D (Down), in order to keep the output and feedback signals of the phase-locked loop system tracking the reference signal. VCO 22 is configured to respond to these pulses by speeding up or slowing down its output rate.

Each of the plurality of VCO outputs 24 is configured to produce a phase-shifted signal based on the primary output signal. Typically, phase-shifted signals are oriented at regular, fixed phase relationships with the primary output signal, and uniformly span 360 degrees. In one embodiment, there are four VCO outputs, shown at 24a–24d, and the regular fixed phase relationships are 0, −90, −180, and −270 degrees. Alternatively, virtually any number of VCO outputs may be used, and other regular, fixed phase relationships may also be used. For example, there may be six VCO outputs, configured to produce versions of the primary output signal that are shifted by 0, −60, −120, −180, −240, and −300 degrees, respectively.

VCO subsystem 16 also typically includes a VCO output multiplexer 26 coupled to the plurality of VCO outputs 24. The VCO output multiplexer is configured to multiplex the phase-shifted signals from the plurality of VCO outputs 24, to form feedback signal 20. Feedback signal 20 may be referred to as a rotated feedback signal 20, because it is typically constructed from phase-rotated versions of the primary output signal 18.

The VCO subsystem 16 further includes an incrementer 27 coupled to VCO output multiplexer 26. Incrementer 27 is configured to receive an incrementer input value via input 28 and produce an incrementer output value that drives the VCO output multiplexer 26. The incrementer input value typically includes an integer component, and as discussed below, may also include a fractional component. The incrementer output value is typically a current sum of incrementer input values totaled by adder 30. Adder 30 is configured to roll over at four, or some other predetermined limit, typically the number of inputs of VCO multiplexer 26. Because it is the sum of incrementer input values, incrementer output value also typically includes an integer component, and may also include a fractional component.

Figure 2:
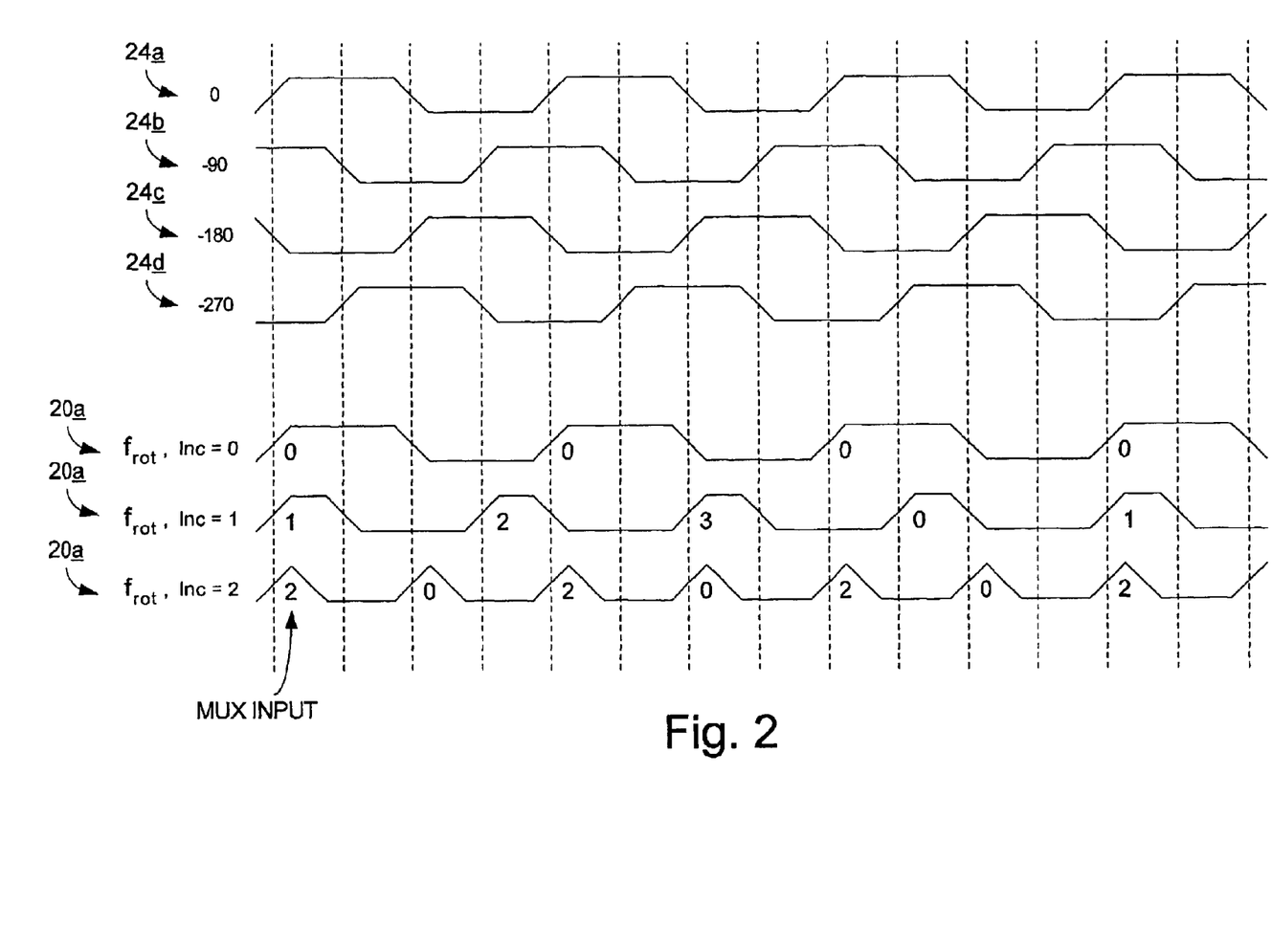
FIG. 2 is a graph showing various phase-shifted VCO output signals, and composite feedback signals formed therefrom.

Typically, the incrementer output value drives VCO output multiplexer 26 to select a particular multiplexer input corresponding to a VCO output channel 24. For the four multiplexer inputs (0, 1, 2, 3) corresponding to VCO output channels 24a–24d, the incrementer output values are typically 0, 1, 2, or 3. These incrementer output values may be obtained by using incrementer input values of 0, 1, 2, or 3 as well. The following table illustrates the VCO output selection behavior of VCO output multiplexer for each of these incrementer input values. A graph of the phase-rotated feedback signals produced by the VCO multiplexer for each of incrementer input values 0, 1, and 2 is shown in FIG. 2, discussed below.

| Incrementer Input Value | Incrementer Output Value (i.e., selected VCO output channel) |
| --- | --- |
| 0 | 0, 0, 0, 0 |
| 1 | 0, 1, 2, 3 |
| 2 | 0, 2, 0, 2 |
| 3 | 0, 3, 2, 1 |

Adder 30 is typically coupled to an output control register 32, which receives as an input the phase-rotated feedback signal 20. The output control register is configured to detect rising edges in the feedback signal 20, and output an integer component of the incrementer output value to the VCO output multiplexer 26 upon detecting the rising edge. Thus, at each rising edge in the rotated feedback signal 20, the multiplexer selection is incremented by the integer component of the incrementer output value supplied by the incrementer. With this arrangement, the output of the incrementer is said to be "clocked" using the feedback signal from the multiplexer.

A divide-by-N' divider 34 is configured to divide the feedback signal by N' before sending the signal to the phase frequency detector 12. N' is used herein to distinguish from N values in prior art phase-locked loops. Although a divide by N' divider is shown only on system 10, it will be appreciated that it may be used to divide the feedback signals of any of the various other embodiments described herein.

The phase-locked loop system described above with reference to FIG. 1 typically operates to produce a primary output signal ($f_{out}$) based on a reference signal ($f_{ref}$) according to the following relationship, where Inc is an integer incrementer input value supplied to incrementer 27.

$$f_{OUT} = \frac{4 - Inc}{4} N' f_{ref}$$

According to the present phase-locked loop system, it is not necessary to divide the reference signal down, so the system is typically able to use nearly every reference edge in the reference signal, and make more corrections, which are consequently smaller, in order to keep the output signal locked on the reference signal. This enables the system to suffer less jitter than prior art phase-locked loops.

When the incrementer input value is an integer, the incrementer output value will be an integer, and the cycle times and duty cycle of the feedback signal will be constant. The phase-locked loop output duty cycle is typically unaffected by the unbalanced pulse widths of the various possible feedback signal waveforms, because the feedback signal typically drives only digital components, namely, the phase frequency detector 12, divide-by-N' divider 34, and output control register 32. These digital components typically are only sensitive to the rising edge of the feedback signal.

The graph of FIG. 2 shows exemplary signals carried on phase-rotated VCO outputs 24a–24d. VCO output signal 24a is rotated by 0 degrees, and is thus identical in phase to primary output signal 18. VCO output signals 24b, 24c, and 24d are rotated by −90, −180, and −270 degrees, respectively, from the primary output signal 18. The graph also shows phase-rotated feedback signals 20a–20c produced by the VCO multiplexer for each of incrementer input values 0, 1, and 2, respectively. Feedback signal 20a is identical to VCO output signal 24a, because the incrementer input value of zero causes the VCO output multiplexer 26 to skip zero channels during its channel selection cycle, thus constantly selecting the same VCO output signal, and, if initialized to zero, selecting VCO output zero (24a) for output to the feedback signal 20a.

Feedback signal 20b is a composite of VCO output signals selected from multiplexer inputs 1, 2, 3, and 0, because the incrementer input value of 1 causes the multiplexer to cycle one by one through multiplexer inputs 1, 2, 3, and 0. Feedback signal 20c is a composite of VCO output signals selected from multiplexer inputs 2, 0, 2, and 0, because the incrementer input value of 2 causes the multiplexer to cycle by twos through multiplexer inputs 2, 0, 2, and 0.

Alternatively, finer control over the primary output signal frequency is possible while keeping the incrementer input value an integer. For example, more VCO output phases may be used to provide finer resolution of the feedback signal. Additionally, an interpolator 26a may be provided that is configured to use interpolation in order to generate signals with phases in between VCO output phases. While typically the incrementer 27 is clocked using the multiplexer 26 output, that is using feedback signal 20, alternatively the incrementer may be clocked using an output of the interpolator, as shown in FIG. 1A. While interpolator 26a is shown only on system 10, it will be appreciated that it may be used in combination with any other of the embodiments described herein.

In addition, finer control of the ratio between the reference signal and the primary output signal may also be gained by making the incrementer input value a number having a fractional component and an integer component. Typically, this finer control is accomplished by extending the incrementer input and output values to have more bits, and the most significant bits are used to control the multiplexer 26. For example, the incrementer input and output values may be extended to have 6 bits, and the first two may be used to control the multiplexer.

Typically, the integer component of the incrementer output value is used to drive the VCO output multiplexer, and the fractional component carries over. As the carried over fractional components add up, they will eventually affect the integer component of the incrementer output value. Thus, an incrementer input value with a fractional component typically causes the multiplexer to produce a feedback signal that does not have a constant pulse width or cycle time.

Figure 3:
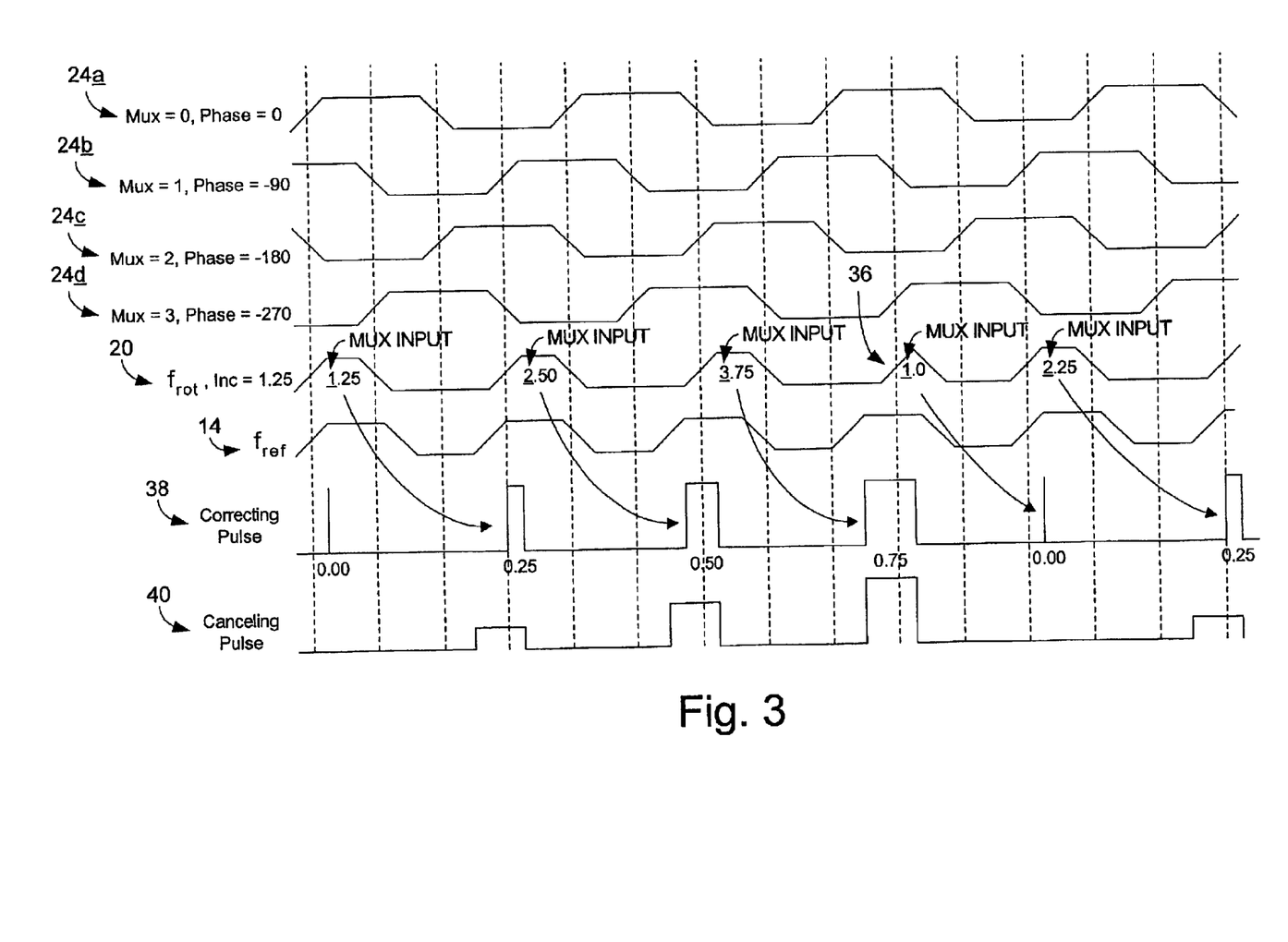
FIG. 3 is a graph showing various phase-shifted VCO output signals, a composite feedback signal formed therefrom, and correcting and canceling pulses produced as a result of the non-constant cycle time of the feedback signal.

As shown in FIG. 3, an incrementer input value of 1.25 will cause adder 30 to add 1.25 at each step, resulting in successive incrementer output values of 1.25, 2.5, 3.75, 1.0, 2.25. The adder 30 typically is configured to roll over to zero when it has reached four, or another predetermined integer corresponding to the number of input channels on the multiplexer. The incrementer typically outputs only the integer portion (underlined in FIG. 3) of the incrementer output value to the multiplexer. Thus, integer values of 1, 2, 3, 1, 2 are output to the multiplexer in the example shown in FIG. 3. This causes the multiplexer to select VCO output signals 24b, 24c, 24d, 24b, 24d, etc.

Unlike where the incrementer output value is an integer, the cycle time of the feedback signal ($f_{rot}$) 20 is not typically constant when the incrementer output value includes a fractional component (frac). In the depicted example, the width of the pulse shown at 36 is shorter than the remaining pulses in the feedback signal. Even when the phase-locked loop system 10 is in lock, the rising edges of the reference signal and the feedback signal will not always match. The mismatch will cause the phase frequency detector 12 and any associated charge pumps to output correcting pulses, which are discussed in detail below.

If the PLL bandwidth is low enough, the effect of these varying correcting pulses will be filtered out such that the primary output signal will have a constant period. However, a low bandwidth will inhibit the PLL from closely tracking the reference signal and increase the long term and tracking jitter.

Assuming there is no noise on either the reference signal or the feedback signal, these correcting pulses are predictable; their width is proportional to the fractional component (frac) of the incrementer output value from the incrementer. These predictable pulses are shown at 38 in FIG. 3. In actual practice, there typically will be noise on the reference signal and the feedback signal, and thus the pulses emitted from the correcting charge pumps will be a combination of the predictable pulses, representing the error in the position of the feedback signal edges from a constant cycle time, and the pulses correcting for noise on the reference signal and the feedback signal. However, noise is not shown in FIG. 3.

To keep the phase lock loop system 10 tracking properly, it is typically necessary to eliminate the predictable portion of the correcting pulses 38 produced as a result of the non-constant cycle time of the feedback signal. These unwanted portions of the correcting pulses may be eliminated by forming opposite pulses with canceling charge pumps, shown at 40 in FIG. 3, and adding those pulses to the correcting charge pump pulses. Any remaining charge will be whatever is necessary to maintain a lock on the reference signal. It is often difficult to vary the width of a pulse numerically, so instead the pulse width of the canceling charge pump is typically kept constant and the current is varied to produce the canceling pulse 40, as shown in FIG. 3.

While the incrementer input value typically is kept constant over time, it will be appreciated that the incrementer input value may vary over time according to a predetermined drift pattern. For example, the incrementer input value may follow a sawtooth pattern, (e.g. 0, 1, 2, 3, 2, 1, 0), a sinusoidal pattern, a square wave pattern, etc. This will cause the primary output phase and/or frequency to vary within a predetermined range, which is desirable in certain spread-spectrum applications.

Figure 4:
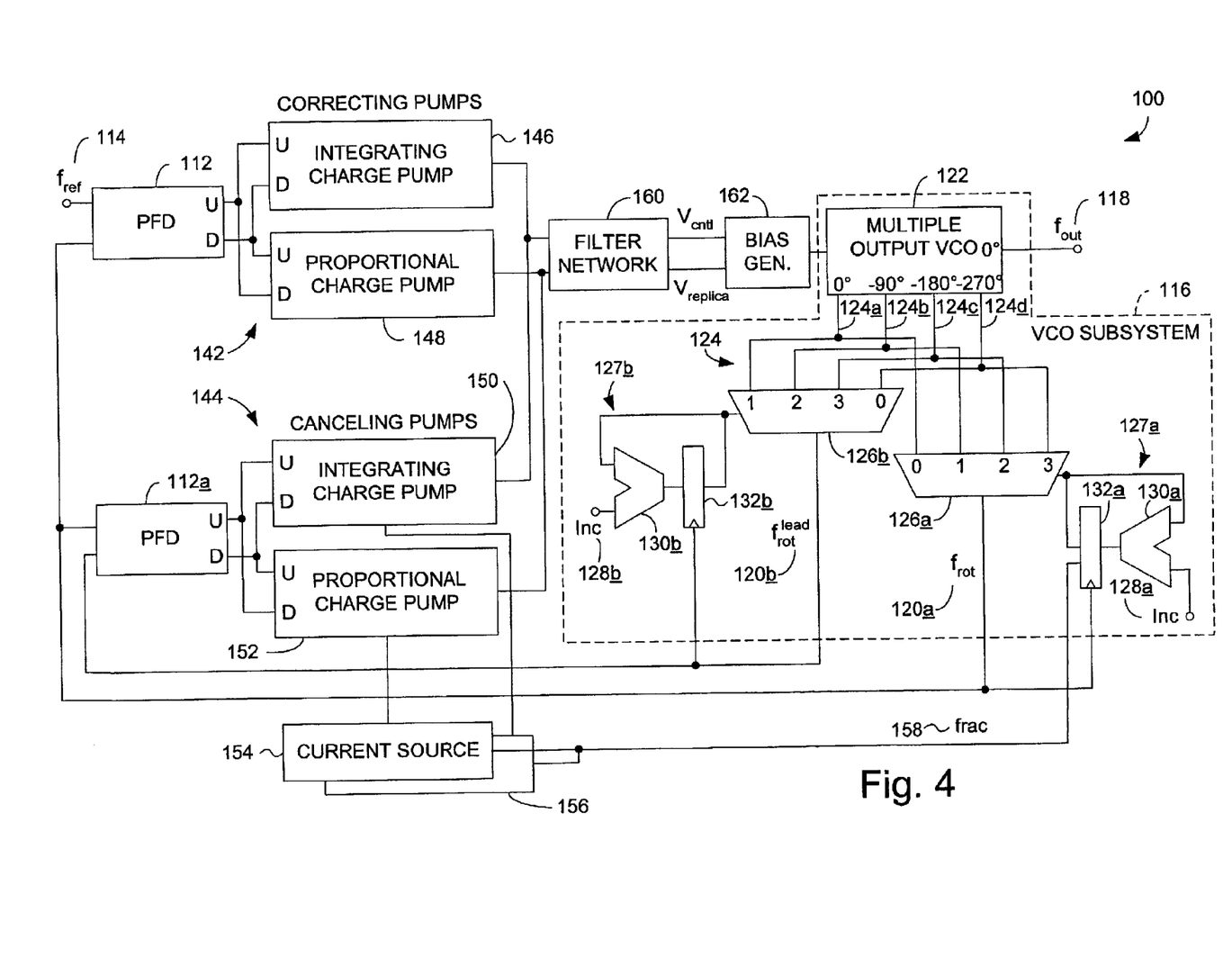
FIG. 4 is a schematic view of a phase-locked loop system according to another embodiment of the present invention, incorporating various charge pumps.

Turning now to FIG. 4, another embodiment of a phase-locked loop system according to the present invention is shown generally at 100. Many components of system 100 are similar to those described above with relation to system 10, and will not be re-described in detail. Similar components in system 10 and system 100 are labeled with reference designators that differ by 100.

Phase-locked loop system 100 typically includes a phase frequency detector 112 configured to receive a reference signal 114. A pair of correcting charge pumps 142 are coupled to the output of phase frequency detector 112. The pair of correcting charge pumps includes a correcting integrating charge pump 146 and a correcting proportional charge pump 148. The phase frequency detector is configured to compare the phase difference between the reference signal and the feedback signal, and output speed up and/or slow down pulses out of outputs U and D, in order to keep the output signal of the phase-locked loop system tracking the reference signal. The correcting charge pumps 142 are configured to output correcting pulses in order to correct noise or mismatches in the feedback signal to keep the reference signal tracking the feedback signal.

Figures 5, 6, 7:
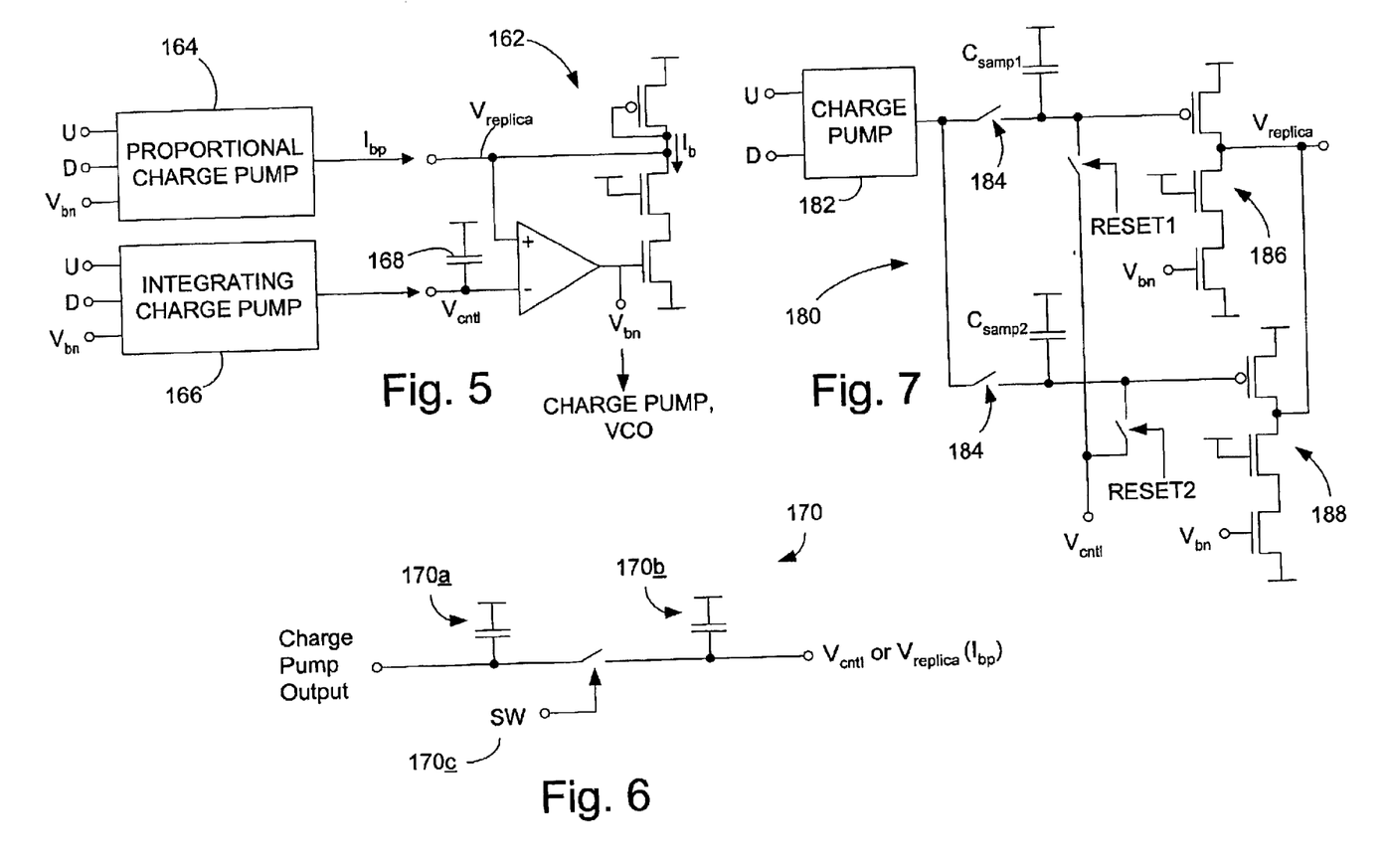
FIG. 5 is a schematic view of a charge pump system and bias generator according to one embodiment of the present invention.
FIG. 6 is a schematic view of a filter network of the phase-locked loop system of FIG. 4.
FIG. 7 is a schematic view of another filter network that may be used with the phase-locked loops of the present invention.

As seen in FIGS. 4 and 5, the phase-locked loops of the present invention may include various charge pumps to provide both integrating and proportional control over the output signal of the PLL system. Referring particularly to FIG. 5, a charge pump system and bias generator 162 are shown, with the charge pump system including a proportional charge pump 164 and an integrating charge pump 166.

Typically, proportional charge pump 164 and integrating charge pump 166 are similar, if not identical, in construction and internal operation. It will be appreciated, however, that the current between the integrating and proportional charge pumps may be different. Both pumps respond to the U and D error signals by pumping charge for application to bias generator 162. The pumped charge leads to variation in a bias current $I_b$ within bias generator 162, which produces a biasing signal $V_{bn}$ to dynamically control various current sources within the PLL system. In particular, biasing signal $V_{bn}$ dynamically biases operation of the charge pumps to improve control over the PLL control dynamics and to reduce static phase offsets between the reference signal ($f_{ref}$) and the output signal ($f_{out}$), and controls the current sources driving the voltage-controlled oscillators of the present invention in order to vary their output oscillation frequencies. In addition, bias generator 162 typically contains an internal impedance that matches an effective impedance of the voltage-controlled oscillator, so as to improve noise rejection in the PLL system. Co-pending U.S. patent application Ser. No. 10/059,503, by John G. Maneatis, entitled "Self-Biasing Phase-Locked Loop System," filed on Jan. 28, 2002, and co-pending U.S. patent application Ser. No. 10/059,945, by John G. Maneatis, entitled "Phase-Locked Loop with Conditioned Charge Pump Output," filed on Jan. 28, 2002, provide further description of the interaction between the charge pumps, bias generator, and oscillator, and describe additional components and features that may be implemented with the present invention.

Referring still to FIG. 5, the proportional and integrating charge pumps are distinguished by the signal path to bias generator 162, and by the way pumped charge is applied to the bias generator. Integrating charge pump 166 pumps its output charge along an integrating control path defined between the charge pump and the $V_{cntl}$ node of bias generator 162. The pumped charge is integrated by and stored at capacitor 168. The voltage on this capacitor represents the net accumulated charge resulting from all of the previously applied U and D signals to the integrating charge pump from the phase frequency detector.

By contrast, proportional charge pump 164 pumps its output charge via a proportional control path to the $V_{replica}$ node of bias generator 162. The output charge typically is in the form of a current pulse $I_{bp}$ which is added to or subtracted from the $I_b$ bias current flowing within bias generator 162. In some cases, there may be various capacitances introduced into the proportional control path, though these capacitances typically are much smaller than capacitor 168. Accordingly, the proportional control provided by charge pump 164 normally involves small phase adjustments to the primary output signal ($f_{out}$), where the integrating control provided by integrating charge pump 166 typically involves more gradual adjustments to the frequency of the output signal ($f_{out}$), due to the accumulated charge on capacitor 168 and the filtering effects produced by its relatively large capacitance. As will be explained below, the correcting and canceling charge pumps of the present invention may be implemented to provide both proportional and integrating control.

Referring again to FIG. 4, the fractional component of the incrementer input value may cause the VCO subsystem 116 to create a feedback signal 120a with a non-constant cycle time or pulse width, as discussed above. This will cause correcting charge pumps 142 to output correcting pulses to attempt to correct for the non-constant cycle time or pulse width. To compensate, phase-locked loop system 100 also typically includes a pair of canceling charge pumps 144 coupled on an output side to the output of the correcting charge pumps, and on an input side to phase frequency detector 112a. The pair of canceling charge pumps includes a canceling integrating charge pump 150 and a canceling proportional charge pump 152.

Canceling charge pumps 150, 152 are connected to respective current sources 154, 156, which in turn are coupled to the output control 132 of incrementer 127. Current sources 154, 156 are digitally programmable current mirrors that establish the canceling charge pump current as a fraction of the correcting charge pump current. The current mirrors may be merged with the canceling charge pumps such that the programmability is in enabling charge pump switches.

The output control register 132 is configured to output the fractional component frac 158 of the incrementer output value as tallied by the incrementer, to current sources 154, 156. Thus, canceling charge pumps 150, 152 are driven to output canceling pulses, shown at 40 in FIG. 3, based on the fractional component of the incrementer. These canceling pulses 38 are opposite of, and meant to compensate for, correcting pulses 40. To avoid jitter due to mismatches, the canceling pumps are driven from a canceling phase frequency detector 112a matching the correcting phase frequency detector 112, and the canceling charge pump is similar in construction to the correcting charge pump. Combined with current sources 154, 156, canceling charge pumps 150, 152 can output a precise fraction of the correcting charge pump current.

Even if the canceling charge pumps 144 subtract exactly the same charge as the correcting charge pumps 142, variations in the timing between the correcting pulses 38 and canceling pulses 40 may lead to an unwanted ripple in the combined output. The correcting and canceling current pulses generated by correcting charge pumps 142 and the canceling charge pumps 144 typically occur within a quarter of the primary output signal ($f_{out}$) period, but these pulses typically will not be coincidental. This timing variation is principally due to the fact that the correcting pulse varies in width while the canceling pulse varies in amplitude. Another, smaller effect stems from the difference in latency between the D and U charge pump inputs and the charge pump output, which arises because the D input typically acts through a current mirror and the U input does not.

To eliminate this ripple, phase-locked loop system 100 typically includes a filter network 160 coupled to an output of the correcting charge pumps. Typically, the filter network is configured to eliminate this ripple by accumulating the output charge on a capacitor in isolation, and then passing it into a bias generator 162, typically when both charge pumps are off and the voltage has stabilized.

One circuit that may be used to accomplish this task within filter network 160 is shown in FIG. 6 at 170. Filter network circuit 170 may be applied to both the integrating and proportional charge pump outputs. Accordingly, filter network 160 typically includes two circuits such as 170, one coupled to the output of correcting integrating charge pump 146 and the other coupled to the output of correcting proportional charge pump 148.

Filter network circuit 170 typically includes an input from a charge pump 142 or 144, coupled to a pair of capacitors 170a, 170b separated by a switch (SW) 170c. Switch 170c is controlled by a switch control signal. There are a number of different ways of generating this switch control signal. One way is to note that since the feedback signal ($f_{rot}$) always leads leading feedback signal 120b ($f_{rot}^{lead}$), described below, the canceling phase frequency detector will always have one output (U) pulse wider than the other (D), and when that long pulse is low the canceling charge pump will be quiescent and switch 170c can be closed. When coupled in the proportional control path described above, circuit 170 outputs to the $V_{replica}$ node of bias generator 162, typically by applying $I_{bp}$ current pulses to the bias generator. When coupled within the integrating control path, circuit 170 outputs its charge to the $V_{cntl}$ node of bias generator 162.

FIG. 7 provides another example of a circuit 180 that may be implemented within filter network 160. Circuit 180 provides various sampling and switching operations in connection with output from charge pump 182. Sampling capacitors $C_{samp1}$ and $C_{samp2}$ are alternately charged by the output of charge pump 182, via operation of switches 184. Alternatively deasserting (opening) reset switches RESET1 and RESET2 will cause the resulting sampled charges to alternately drive a time-averaged proportional control current into the $V_{replica}$ node of the bias generator, through operation of $g_m$ stages 186 and 188. When asserted, RESET1 and RESET2 also cause the residual charge on the sampling capacitors to be dumped into the $V_{cntl}$ node of the bias generator, where the residual charge accumulates on a capacitor (e.g., capacitor 168) to provide integrating control. Circuit 180 allows use of a single charge pump to provide both integrating and proportional control.

Referring again to FIG. 4, phase-locked loop system 100 also typically includes a pair of VCO output multiplexers 126a, 126b coupled to outputs 124 of VCO 122. VCO output multiplexer 126a is configured to produce a feedback signal 120a that is sent back to the input of phase frequency detectors 112 and 112a. VCO output multiplexer 126b is configured to output a leading feedback signal 120b to an input of phase frequency detector 112a. Feedback signal 120a is produced using incrementer 127a, including input 128a, adder 130a, and output control register 132a, to drive VCO output multiplexer 126a, as described above in relation to phase-locked loop system 10.

Leading feedback signal 120b is produced by VCO output multiplexer 126b, which is configured with multiplexer inputs connected to VCO outputs 124a–124d in a manner that leads VCO multiplexer 126a by some predetermined interval, such as 90 degrees, or 360 degrees divided by the number of VCO outputs. In the depicted configuration, VCO output 124a is connected to multiplexer input 1 on VCO multiplexer 126b, and to multiplexer input 0 on VCO multiplexer 126a. Similarly, VCO output 124b is connected to input 2 on VCO multiplexer 126b, and input 1 on VCO multiplexer 126a; VCO output 124c is connected to input 3 on VCO multiplexer 126b, and input 2 on VCO multiplexer 126a; and VCO output 124d is connected to input 4 on VCO multiplexer 126b, and input 3 on VCO multiplexer 126a. As a result, feedback signal ($f_{rot}$) always leads leading feedback signal ($f_{rot}^{lead}$) by 90 degrees, or alternatively by some other predetermined phase value.

The leading feedback signal 120b is routed to phase frequency detector 112a. Incrementer 127b, including input 128b, adder 130b, and output control register 132b function to drive VCO output multiplexer 126b in a similar manner as described above in relation to system 10. To insure that incrementers 127a, 127b are synchronized to the same value, a synchronization link between the two is typically provided. This may be accomplished by making one a partial slave using most of the logic from the other.

It will be appreciated that the timing relationship between the correcting pulses and canceling pulses can be manipulated by using a trailing feedback signal instead of a leading feedback signal and/or changing the sign or representation of frac value (adding or subtracting a constant). This may be accomplished by changing the order of the inputs of VCO output multiplexer 126b, to, for example, 3, 0, 1, 2. Typically, the timing is adjusted such that the correcting and canceling pulses either start or end at the same time. In addition, the integer portion can be formed by rounding to the nearest integer, rather than truncating, such that frac can be both positive and negative. Other rounding or truncation methods can also be used.

The canceling PFD 112a is fed the feedback signal 120a ($f_{rot}$) and the leading feedback signal ($f_{rot}^{lead}$). The edges of these two signals are typically separated by a leading phase difference of about one-fourth of the cycle time of $f_{out}$ which is typically the maximum asymptotic separation of $f_{ref}$ and $f_{rot}$ edges. Alternatively, they may be separated by another predetermined leading phase difference. On any particular cycle, the expected difference between the $f_{ref}$ and $f_{rot}$ edges will be some fraction of this asymptotic separation, given by frac. By scaling the current in the canceling charge pump by frac, the charge emitted by these pumps can be made to exactly cancel the unwanted portion of the correcting charge pumps.

Preferably, the correcting phase frequency detector 112a is designed not to reset arbitrarily, to avoid the possibility that it might become confused and determine that the feedback signal ($f_{rot}$) was leading the leading feedback signal ($f_{rot}^{lead}$). This reset issue does not arise for the correcting phase frequency detector 112 since it can arbitrarily decide which signal is ahead and which is behind, so long as it is consistent from one cycle to the next.

Figure 8:
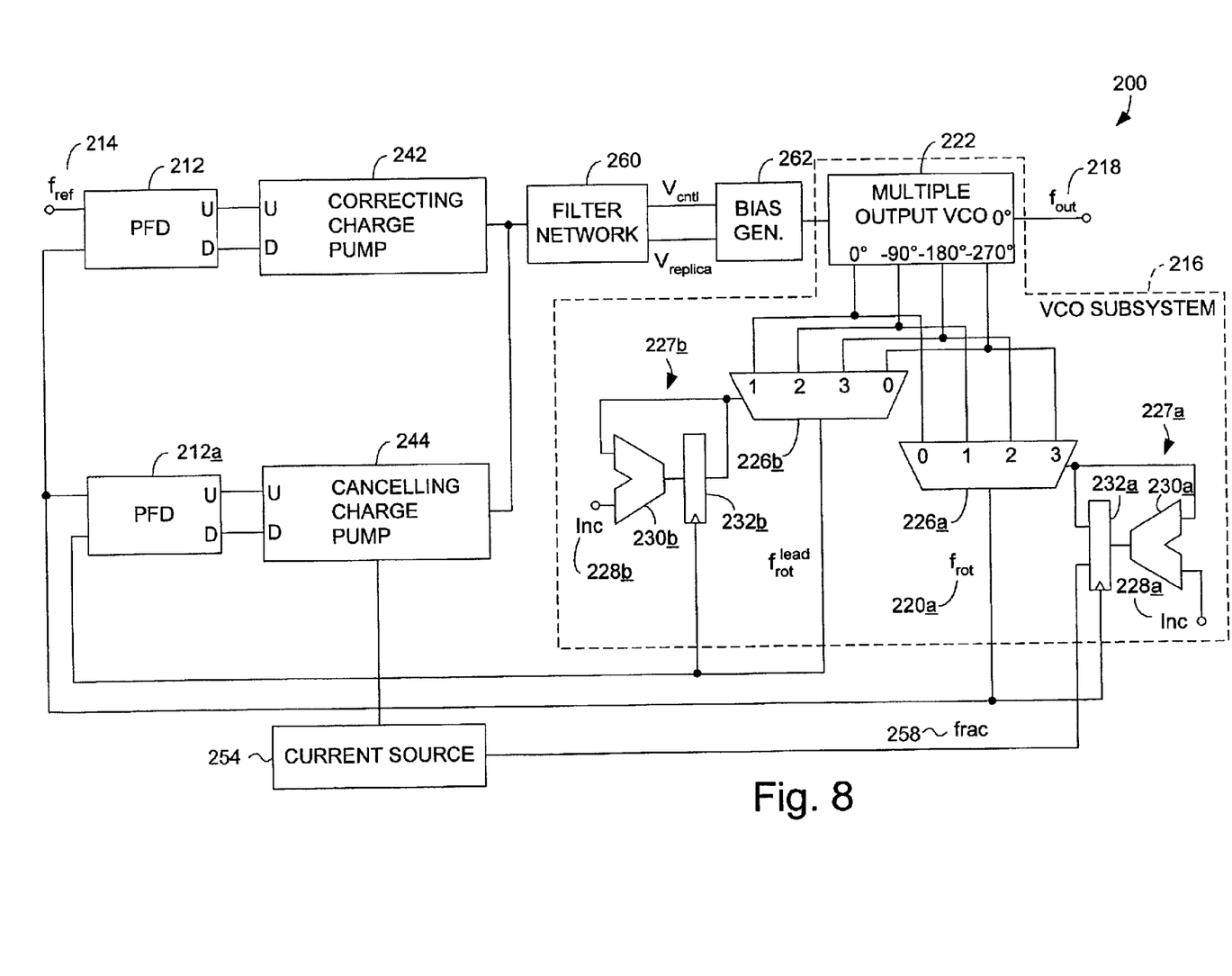
FIG. 8 is a schematic view of a phase-locked loop system according to another embodiment of the present invention, incorporating fewer charge pumps.

Turning now to FIG. 8, another embodiment of a phase-locked loop system according to the present invention is shown generally at 200. Many components of system 200 are similar to those described above with relation to systems 10 and 100, and will not be re-described in detail. Similar components in system 200 and system 100 are labeled with reference designators that differ by 100.

Phase-locked loop system 200 typically includes a phase frequency detector 212 configured to receive a reference signal 214. A single correcting charge pump 242 is coupled to the output of phase frequency detector 212. Alternatively, more than one correcting charge pump may be used, as discussed above. Phase-locked loop system 200 also typically includes a single canceling charge pump 244 coupled to canceling phase frequency detector 212a. Alternatively, more than one canceling charge pump may be used, as discussed above. Typically, system 200 does not include any integrating charge pumps. Alternatively, one or more integrating charge pumps may be included in system 200.

Canceling charge pump 244 is coupled to current source 254, which is in turn is configured to receive a fractional component (frac) 258 of the increment total from output control register 232a of incrementer 227a. Canceling charge pump 244 is configured to output canceling pulses based on this fractional component (frac) to compensate for non-constant cycle time and pulse width that may be present in feedback signal 220a, as described above. Filter network 260, bias generator 262, and VCO subsystem 216, including multiplexers 226a, 226b, incrementers 227a, 227b (including adders 230a, 230b and output control registers 232a, 232b), all function as described above in relation to systems 10 and 100, in order to produce an output signal 218 that is at a desired frequency relationship relative to reference signal 214, which has reduced jitter.

It will also be appreciated that filter network 260 may alternatively include a resistor in series with a capacitor between $V_{co}/V_{ss}$ and $V_{cntl}$, or may contain more complex filter networks like filter network 180.

Figure 9:
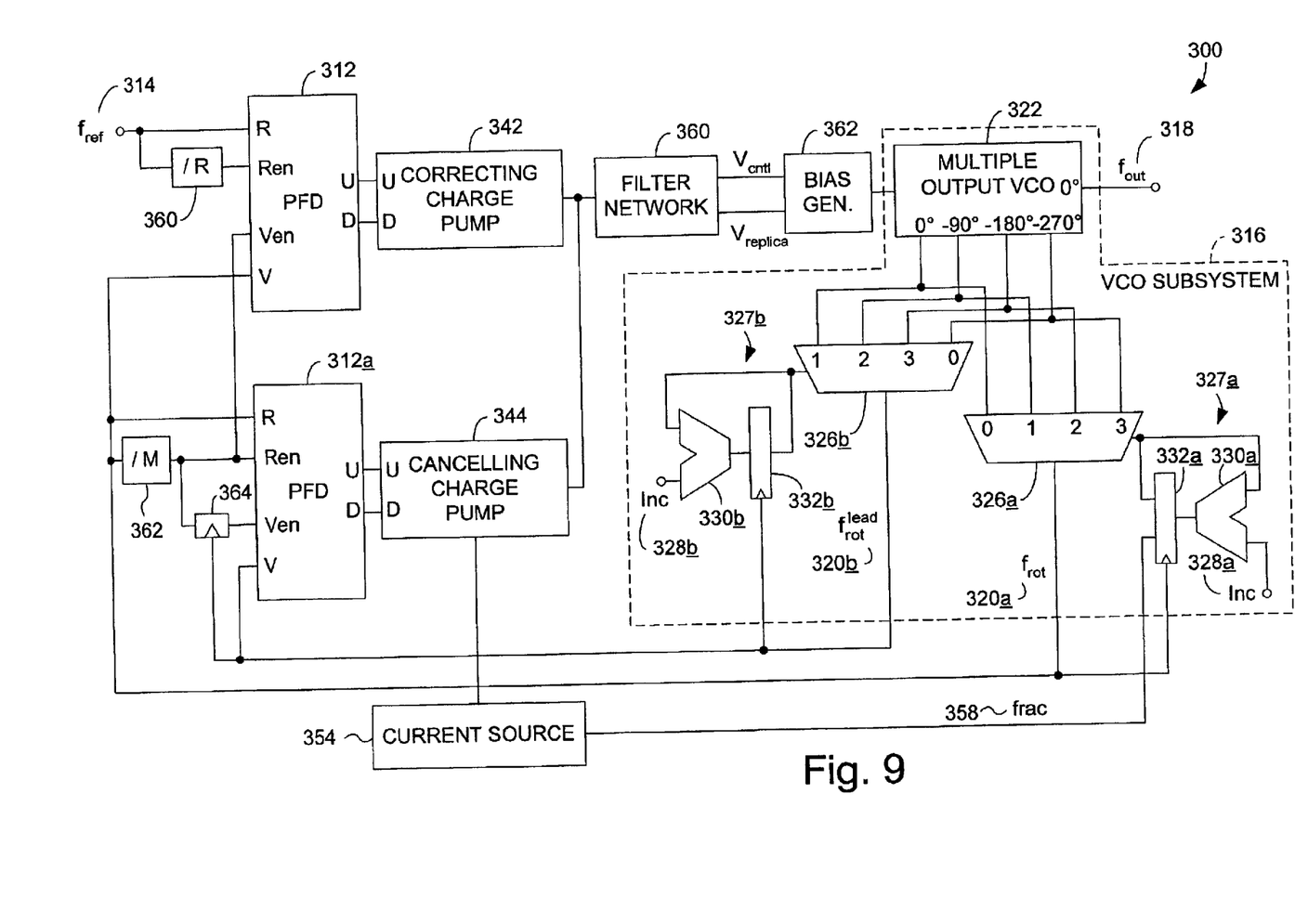
FIG. 9 is a schematic view of a phase-locked loop system according to another embodiment of the present invention, incorporating dividers on certain inputs of the phase frequency detectors.

Turning now to FIG. 9, a phase-locked loop according to another embodiment of the invention is shown generally at 300. Many components of system 300 are similar to those described above with relation to systems 10, 100, and 200, and will not be re-described in detail. Similar components in system 300 and system 200 are labeled with reference designators that differ by 100.

Phase-locked loop system 300 typically includes a phase frequency detector 312 configured to receive a reference signal 314 and a divided reference signal that has passed through a divide-by-R divider 360. The phase frequency detector is coupled on an output-side VCO subsystem 316 via one or more correcting charge pumps 342, a filter network 360, and a bias generator 362. VCO subsystem includes a multiple output VCO 322 and a pair of VCO multiplexers 326a, 326b, coupled to outputs of the VCO 322. VCO 322 is configured to produce primary output signal 318, that is in a predefined frequency relationship with reference signal 314.

VCO multiplexer 326a is driven by incrementer 327a (including an adder 330a and output control register 332a), and is configured to produce a phase-rotated feedback signal 320a as described above. Leading VCO multiplexer 326b is driven by incrementer 327b (having an adder 330b and output control 332b), and is configured to produce a leading feedback signal 320b, as described above. Alternatively, as discussed above, feedback signal 320b may be a trailing feedback signal.

Feedback signal 320a is fed back into correcting phase frequency detector 312 for correction vis a vis reference signal 314, and into canceling phase frequency detector 312a for correction relative to a leading feedback signal 320b. In addition, a divide-by-M divider is coupled to an input of canceling phase frequency detector 312a, and configured to supply canceling phase frequency detector 312a a divided feedback signal.

Where the incrementers 327a, 327b are programmed to output an incrementer output value that includes a fractional component, a feedback signal 320a with a non-constant cycle time and pulse width will be produced, and correcting charge pump 342 will respond by outputting unwanted correcting pulses 38. To compensate for these unwanted correcting pulses, leading VCO multiplexer 326b is configured to output leading feedback signal 320b, which is fed into a canceling phase frequency detector 312a via input control register 364. Canceling phase frequency 312a is configured to cause canceling charge pump 344 to output canceling pulses 40 to compensate for the unwanted correcting pulses. The current for these canceling pulses is supplied by current source 354, and is based upon a fractional component frac received from the output control register 332a of incrementer 327a, as discussed above.

By using a multibit incrementer input value (input F in the equation below) to drive both the selection of rotated versions of the VCO output, and a programmable current canceling charge pump, phase-locked loop system 300 may be created, which can multiply the input clock by a high-resolution number within a predetermined range, typically between about 0.5 and about 1.0, while still using every reference edge for correction.

With the inclusion of the reference divider 360 and feedback divider 362 it is possible to extend this design to multiply an input reference signal 314 by the very flexible ratio given below, where M and R are integers and F is a number in a predetermined range, typically between about 0.5 and about 1.0.

$$f_{OUT} = f_{ref} \frac{M}{R} F$$

This gives the implementation a large frequency range while simultaneously using most or all of the reference edges for correction. The integrating and proportional correcting charge pumps of system 100 can be added to extend the resolution of F. Also, a programmable output divider can be coupled to the primary output signal to allow the phase-locked loop system to cover a range of 2x for x≧0.

Figure 10:
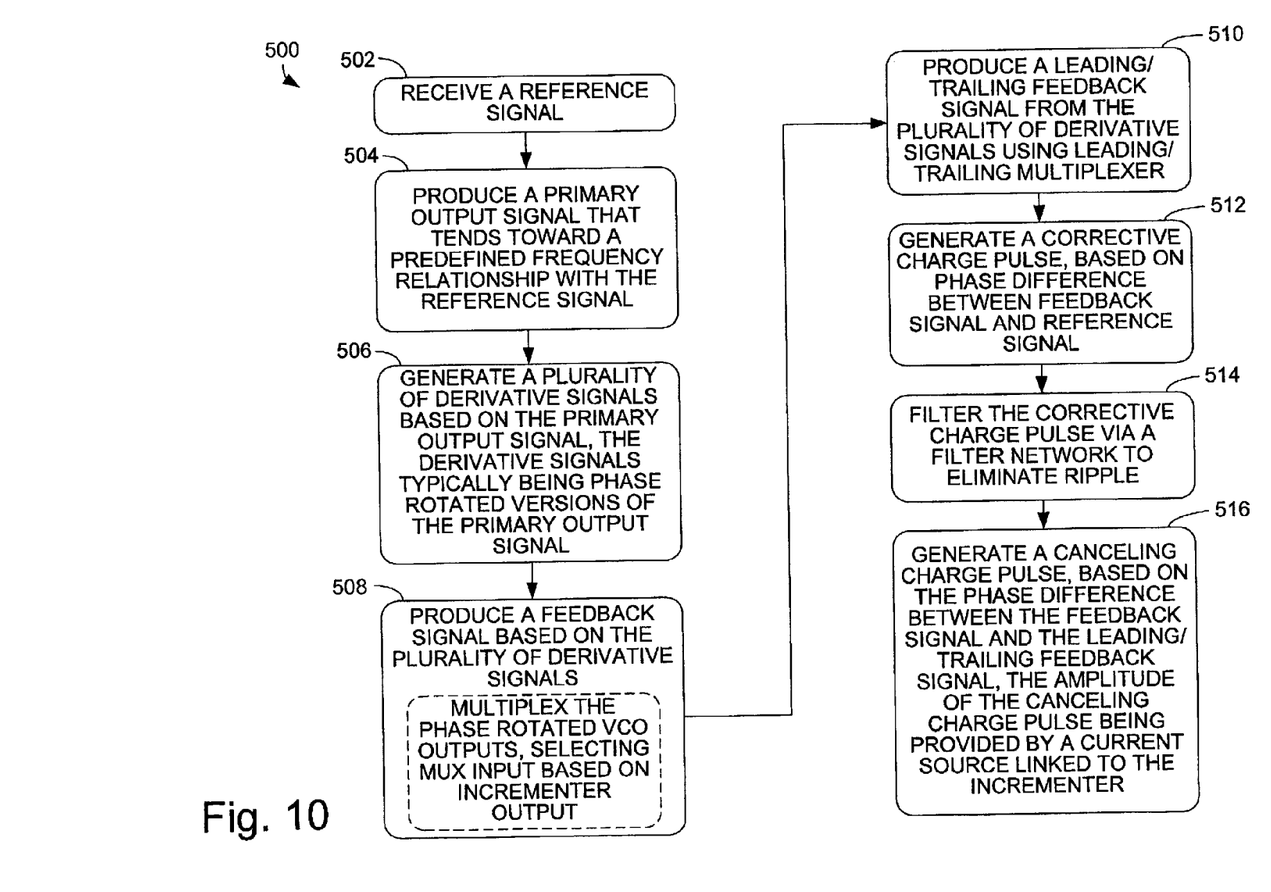
FIG. 10 is a flowchart of a method according to one embodiment of the present invention.

A method according to one embodiment of the present invention is shown generally at 500 in FIG. 10. Method 500 typically includes, at 502, receiving a reference signal, and at 504, producing a primary output signal that tends toward a predefined frequency relationship with the reference signal, as discussed above.

The method further includes, at 506, generating a plurality of derivative signals based on the primary output signal. Typically, the plurality of derivative signals are the VCO outputs discussed above, and are generated in regular fixed phase relationships with the primary output signal. The regular fixed phase relationships typically span 360 degrees in uniform intervals. According to one embodiment of the invention, the regular fixed phase relationships are 0, −90, −180, −270 degrees.

At 508, the method includes, producing a feedback signal based on the plurality of derivative signals. Typically, the feedback signal is produced by multiplexing the plurality of derivative signals together to form the feedback signal. This process typically involves selecting from among of a plurality of VCO output signals to form the feedback signal, based on an incrementer output value produced by the incrementer. The incrementer output value is typically produced based on an incrementer input value, as discussed above. Typically, multiplexing includes reading an incrementer output value produced by an incrementer, and selecting a derivative signal to include in the feedback signal based on the incrementer output value. The output of the incrementer is typically clocked using the feedback signal, as discussed above.

The method may also include producing the incrementer output value at least in part by summing incrementer input values over a period of time. This is typically accomplished using an adder, which rolls over at a predetermined value, such as four, as discussed above.

The incrementer input and output values may include integer components and fractional components. Thus, the method may include reading an integer component of the incrementer output value, and selecting the derivative signal may include selecting a multiplexer input based on the integer component of the incrementer output value.

Because the incrementer output value may be produced based on an incrementer input value with a fractional component, the method may further include producing a feedback signal with a non-constant cycle time, as discussed above.

At 510, the method further includes producing a leading feedback signal from the plurality of derivative signals. This is typically accomplished using a leading multiplexer, such as 126b, discussed above. Alternatively, a trailing feedback signal may be produced using a trailing multiplexer.

At 512, the method may further include generating a correcting charge pulse in response to the non-constant cycle time of the feedback signal, based on the phase difference between the non-constant feedback signal and the reference signal. At 514, the method typically includes filtering the correcting charge through a filter network. The filter network is configured to eliminate output ripple from the correcting charge pump, as described above.

Because the portion of the correcting charge pulse generated at 512 is typically unwanted, the method may further include, at 516, generating a canceling pulse to compensate for the correcting pulse. Typically, the timing of the canceling charge pulse is based on the phase difference between the feedback signal and the leading feedback signal, and the amplitude of the canceling charge pulse is based on current provided by a current source linked to the incrementer. The current is generated based on a fractional component of the incrementer output value from the incrementer. The canceling pulse is typically opposite of the correcting pulse, and the pulse width of the canceling pulse is typically kept constant and while the amplitude of the canceling pulse is varied, as discussed above. Instead of, or in addition to the filtering provided at 514, filtering may be performed after the canceling pulse is generated (i.e., after 516), so that the filtering is performed on the sum of the correcting and canceling pulses.

It will be appreciated that both integrating and proportional charge pumps may be used, as described above. Thus, the method may further include generating an integrating and a proportional correcting pulse by a correcting integrating charge pump and generating an integrating and a proportional canceling pulse by a correcting proportional charge pump, as discussed above in relation to system 100.

The method may further include dividing the feedback signal by a predetermined value, such as N and M discussed above. The method may also include dividing the reference signal by a predetermined value, such as R, discussed above.

According to another embodiment of the present invention, the method typically includes receiving a reference signal, producing a primary output signal that tends toward a predefined frequency relationship with the reference signal, and producing a feedback signal by rotating the phase of the primary output signal.

The embodiments of the present invention may be used to produce an output signal in a predefined frequency relationship with a reference signal, while keeping tracking jitter low, thereby avoiding various problems associated with the prior art.

While the present invention has been particularly shown and described with reference to the foregoing preferred embodiments, those skilled in the art will understand that many variations may be made therein without departing from the spirit and scope of the invention as defined in the following claims. The description of the invention should be understood to include all novel and non-obvious combinations of elements described herein, and claims may be presented in this or a later application to any novel and non-obvious combination of these elements. Where the claims recite "a" or "a first" element or the equivalent thereof, such claims should be understood to include incorporation of one or more such elements, neither requiring nor excluding two or more such elements.

I claim:

1. A phase-locked loop system, comprising:
   an error detector configured to receive a reference signal; and
   a voltage-controlled oscillator subsystem coupled to the error detector, the voltage-controlled oscillator subsystem being configured to produce a primary output signal that tends toward a predefined frequency relationship with the reference signal, and to produce a feedback signal that is routed in a feedback loop back to the error detector,
   where the voltage-controlled oscillator subsystem includes a multiple output voltage-controlled oscillator having a plurality of VCO outputs, each of the plurality of VCO outputs being configured to produce a phase-sifted signal based on the primary output signal, and
   where the voltage-controlled oscillator subsystem further includes a VCO output multiplexer configured to multiplex the phase-shifted signals from the plurality of VCO outputs, to form the feedback signal.

2. The phase-locked loop system of claim 1, where the plurality of outputs are configured to produce respective signals that are oriented at regular fixed phase relationships with the primary output signal.

3. The phase-locked loop system of claim 2, where the regular fixed phase relationships uniformly span 360 degrees.

4. The phase-locked loop system of claim 3, where the voltage-controlled oscillator includes four outputs and the regular fixed phase relationships are 0, −90, −180, −270 degrees.

5. The phase-locked loop system of claim 1, where the voltage-controlled oscillator subsystem further includes an incrementer coupled to the VCO output multiplexer, the incrementer being configured to produce an incrementer output value that drives the VCO output multiplexer.

6. The phase-locked loop system of claim 5, where the incrementer is clocked using the feedback signal output by the VCO output multiplexer.

7. The phase-locked loop system of claim 5, where the VCO output multiplexer is configured to select from among the plurality of VCO outputs based on the incrementer output value.

8. The phase-locked loop system of claim 7, where there are four VCO outputs and the incrementer output value is an integer selected from the group consisting of 0, 1, 2, and 3.

9. The phase-locked loop system of claim 5, where the incrementer output value is a number including an integer component, and the integer component is used to drive the VCO output multiplexer.

10. The phase-locked loop system of claim 5, where the incrementer is configured to receive incrementer input values from an input, and to produce the incrementer output values based on the incrementer input values.

11. The phase-locked loop system of claim 10, where the incrementer further includes an adder configured to sum incrementer input values over a period of time.

12. The phase-locked loop system of claim 5, where the incrementer is configured produce the incrementer output value based on an incrementer input value that varies over time according to a predetermined drift pattern.

13. The phase-locked loop system of claim 12, where the drift pattern is a sawtooth pattern.

14. The phase-locked loop system of claim 5, where the incrementer is configured to produce the incrementer output value based on an incrementer input value that includes a fractional component.

15. The phase-locked loop system of claim 14, where the fractional component of the incrementer input value causes the multiplexer to produce a feedback signal that does not have a constant cycle time.

16. The phase-locked loop system of claim 15, further comprising, a correcting charge pump coupled to the error detector, the correcting charge pump being configured to output correcting pulses in response to a detected phase error between the reference signal and the feedback signal.

17. The phase-locked loop system of claim 16, further comprising a filter network coupled to an output of the correcting charge pump, the filter network being configured to eliminate output ripple from the correcting charge pump.

18. The phase-locked loop system of claim 17, where the correcting charge pump and filter network are configured to provide both integrating and proportional control over the primary output signal.

19. The phase-locked loop system of claim 16, where the correcting charge pump is configured to output a correcting pulse having an undesirable portion resulting from an attempt by the correcting charge pump to compensate for the non-constant cycle time of the feedback signal.

20. The phase-locked loop system of claim 19, further comprising a canceling charge pump coupled to an output of the correcting charge pump, the canceling charge pump being configured to produce a canceling pulse to compensate for the undesirable portion of the correcting pulse.

21. The phase-locked loop system of claim 20, where the canceling pulse is opposite of the correcting pulse.

22. The phase-locked loop system of claim 20, where the canceling charge pump is configured to keep the pulse width of the canceling pulse constant and vary the amplitude of the canceling pulse.

23. The phase locked loop system of claim 20, where the canceling charge pump is coupled to a current source.

24. The phase-locked loop system of claim 23, where the current source is coupled to an output the incrementer, and is configured to be controlled by the fractional component of the incrementer output value.

25. The phase-locked loop system of claim 24, where the canceling charge pump and incrementer controlled current source are combined such that the charge pump switches are used to also select different current levels.

26. The phase-locked loop system of claim 24, where the canceling charge pump is configured to provide both integrating and proportional control over the primary output signal.

27. The phase-locked loop system of claim 20, where the correcting charge pump is one of a pair of correcting charge pumps coupled to the error detector, the pair of correcting charge pumps including a correcting integrating charge pump and a correcting proportional charge pump; and where the canceling charge pump is one of a pair of canceling charge pumps, each of the canceling charge pumps being coupled to a respective output of one of the correcting charge pumps, the pair of canceling charge pumps including a canceling integrating charge pump and a canceling proportional charge pump.

28. The phase-locked loop system of claim 1, where the VCO output multiplexer is one of a pair of VCO output multiplexers coupled to the plurality of outputs of the voltage-controlled oscillator, a first VCO output multiplexer of the pair being configured to produce a feedback signal that is sent to the error detector, and a second VCO output multiplexer of the pair being configured to produce a leading or trailing feedback signal that is routed to the canceling charge pump via a second error detector.

29. The phase-locked loop system of claim 28, where the first and second error detectors are configured to adjust the timing of the correcting charge pump and the canceling charge pump, at least in part by keeping the canceling pulse of the canceling charge pump either leading or trailing the correcting pulse of the correcting charge pump.

30. The phase-locked loop system of claim 29, where the first and second error detectors are configured to adjust the timing of the correcting charge pump and the canceling charge pump, at least in part by keeping the canceling pulse of the canceling charge pump either beginning or ending at the same time as the correcting pulse of the correcting charge pump.

31. The phase-locked loop system of claim 1, where the voltage-controlled oscillator subsystem further includes an interpolator coupled to the multiplexer, the interpolator being configured to generate an output signal that is a phase-rotated version of the primary output signal, the interpolator output signal having a phase that is in between the predetermined fixed relationships of the VCO outputs.

32. The phase-locked loop system of claim 31, where the voltage-controlled oscillator subsystem further includes an incrementer coupled to the VCO output multiplexer, the incrementer being configured to produce an incrementer output value that drives the VCO output multiplexer, and where the incrementer is clocked using an output of the interpolator.

33. The phase-locked loop system of claim 1, further comprising a divider positioned intermediate the voltage-controlled oscillator subsystem and the error detector, the divider being configured to divide the feedback signal by a predetermined value before the feedback signal is sent to the error detector.

34. The phase-locked loop system of claim 33, where the divider output is used as an enable for the reference signal input of the error detector.

35. The phase-locked loop system of claim 1, further comprising a divider configured to divide the reference signal before passing it to the error detector.

36. The phase-locked loop system of claim 35, where the divider output is used as an enable for the reference signal input of the error detector.

37. A phase-locked loon method, comprising:

receiving a reference signal;

producing a primary output signal that tends toward a predefined frequency relationship with the reference signal;

generating a plurality of derivative signals based on the primary output signal; and producing a feedback signal based on the plurality of derivative signals, where producing the feedback signal based on the plurality of derivative signals includes multiplexing the plurality of derivative signals together to form the feedback signal.

38. The method of claim 37, where the plurality of derivative signals are generated in regular fixed phase relationships with the primary output signal.

39. The method of claim 38, where the regular fixed phase relationships uniformly span 360 degrees.

40. The method of claim 39, where the regular fixed phase relationships are 0, −90, −180, −270 degrees.

41. The method of claim 37, where multiplexing the plurality of derivative signals includes selecting from among of a plurality of VCO output signals to form the feedback signal.

42. The method of claim 37, where multiplexing includes reading an incrementer output value produced by an incrementer, and selecting a derivative signal to include in the feedback signal based on the incrementer output value.

43. The method of claim 42, further comprising clocking the incrementer with the feedback signal.

44. The method of claim 42, further comprising producing the incrementer output value at least in part by summing incrementer input values over a period of time.

45. The method of claim 42, where reading an incrementer output value includes reading an integer component of the incrementer output value, and selecting a derivative signal includes selecting a multiplexer input based on the integer component of the incrementer output value.

46. The method of claim 42, wherein the incrementer output value is produced based on an incrementer input value with a fractional component.

47. The method of claim 46, where the step of producing the feedback signal further includes producing a feedback signal that does not have a constant cycle time, due to the fractional component of the incrementer input value.

48. The method of claim 47, further comprising generating a correcting pulse in response to a detected phase error between the reference signal and the feedback signal.

49. The method of claim 48, further comprising filtering the correcting pulse through a filter network, the filter network being configured to eliminate output ripple from the correcting charge pump.

50. The method of claim 49, further comprising generating a canceling pulse to compensate for the correcting pulse.

51. The method of claim 50, where the canceling pulse is opposite of the correcting pulse.

52. The method of claim 50, where generating the canceling pulse is accomplished at least in part by keeping the pulse width of the canceling pulse constant and varying the amplitude of the canceling pulse.

53. The method of claim 50, further comprising generating the canceling pulse based on current supplied by a current source that is controlled by a fractional component of the incrementer output value.

54. The method of claim 50, where the correcting pulse is generated by a correcting integrating charge pump and where the canceling pulse is generated by a correcting proportional charge pump, the method further comprising:

generating an integrating canceling pulse via an integrating canceling pump; and generating a proportional canceling pulse via a proportional canceling pump.

55. The method of claim 54, where producing the feedback signal further includes generating a leading or trailing feedback signal that is routed to a canceling error detector coupled to the canceling charge pump.

56. The method of claim 37, further comprising dividing the feedback signal by a predetermined value.

57. The method of claim 37, further comprising dividing the reference signal by a predetermined value.

* * * * *